United States Patent
Lee

(10) Patent No.: US 11,133,484 B2
(45) Date of Patent: Sep. 28, 2021

(54) OLED LIGHTING APPARATUS

(71) Applicant: LG DISPLAY CO., LTD., Seoul (KR)

(72) Inventor: Shin-Bok Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 71 days.

(21) Appl. No.: 16/201,781

(22) Filed: Nov. 27, 2018

(65) Prior Publication Data

US 2019/0165302 A1    May 30, 2019

(30) Foreign Application Priority Data

Nov. 28, 2017  (KR) .................. 10-2017-0160218

(51) Int. Cl.
*H01L 51/52*     (2006.01)
*H01L 27/32*     (2006.01)

(52) U.S. Cl.
CPC ........ *H01L 51/5212* (2013.01); *H01L 27/329* (2013.01); *H01L 27/3279* (2013.01); *H01L 51/5253* (2013.01); *H01L 2251/5392* (2013.01)

(58) Field of Classification Search
None
See application file for complete search history.

(56) References Cited

U.S. PATENT DOCUMENTS

| | | | | |
|---|---|---|---|---|
| 2011/0180308 A1* | 7/2011 | Nakamura | .......... | H01L 51/5212 174/255 |
| 2012/0153831 A1 | 6/2012 | Kasai | | |
| 2012/0161166 A1* | 6/2012 | Yamazaki | .......... | H01L 27/3204 257/88 |
| 2012/0292656 A1* | 11/2012 | Yim | .................... | H01L 51/5225 257/99 |
| 2013/0093316 A1* | 4/2013 | Sakaguchi | ............. | H05B 33/26 313/505 |
| 2017/0077210 A1* | 3/2017 | Moon | ................. | H01L 51/5228 |
| 2017/0125723 A1* | 5/2017 | Moon | ................. | H01L 51/5209 |

FOREIGN PATENT DOCUMENTS

| | | |
|---|---|---|
| CN | 104982092 A | 10/2015 |
| EP | 0 888 035 A1 | 12/1998 |
| EP | 1 182 910 A1 | 2/2002 |

(Continued)

OTHER PUBLICATIONS

Great Britain Examination Report dated Apr. 18, 2019 issued in corresponding application No. GB1819316.9 (8 pages).

(Continued)

*Primary Examiner* — Erik Kielin
(74) *Attorney, Agent, or Firm* — Polsinelli PC

(57) ABSTRACT

Disclosed herein is an OLED lighting apparatus which can compensate for high sheet resistance of a first electrode formed of a transparent conductive material while improving light extraction efficiency through enhancement in aperture ratio. For this purpose, the OLED lighting apparatus omits auxiliary wires and, instead of the auxiliary wires, includes a first auxiliary wire and a second auxiliary wire to secure low resistance. As a result, the OLED lighting apparatus can compensate for high sheet resistance of the first electrode, thereby achieving normal light emission without reduction in luminance due to current drop when implemented as a large-area high-resolution lighting apparatus.

7 Claims, 8 Drawing Sheets

(56) References Cited

FOREIGN PATENT DOCUMENTS

| | | |
|---|---|---|
| EP | 1 304 743 A2 | 4/2003 |
| EP | 2 352 360 A1 | 8/2011 |
| EP | 3 144 995 A1 | 3/2017 |
| JP | 2016-518018 A | 6/2016 |
| JP | 2016-164887 A | 9/2016 |
| JP | 2017-103254 A | 6/2017 |
| KR | 20110124640 A | 11/2011 |
| KR | 101372914 B1 | 3/2014 |
| KR | 101447927 B1 | 10/2014 |
| TW | 201024245 A | 7/2010 |
| TW | 201244074 A | 11/2012 |
| TW | 201511379 A | 3/2015 |
| WO | 2010/041611 A1 | 3/2012 |
| WO | WO-2015174669 A1 * | 11/2015 ......... H01L 51/5228 |
| WO | WO-2015174672 A1 * | 11/2015 ......... H01L 51/5209 |
| WO | 2014/122938 A1 | 1/2017 |

OTHER PUBLICATIONS

Office Action dated Jan. 17, 2020 issued in corresponding Taiwanese Application No. 107139362 (22 pages).
Japanese Office Action dated Oct. 31, 2019 issued in a counterpart Japanese Patent Application No. 2018-217440 (6 pages) and translation (7 pages).

\* cited by examiner

OLED LIGHTING APPARATUS

CROSS-REFERENCE TO RELATED APPLICATION

This application claims the benefit of Korean patent application No. 10-2017-0160218 filed on Nov. 28, 2017, the entire content of which is incorporated herein by reference for all purposes as if fully set forth herein.

BACKGROUND

Field of the Disclosure

The present disclosure relates to a display device, and more particularly, to an OLED lighting apparatus which can compensate for high sheet resistance of a first electrode while improving light extraction efficiency through enhancement in an aperture ratio.

Description of the Background

Currently, fluorescent lamps and incandescent lamps are mainly used as a lighting apparatus. The incandescent lamps have a problem of a very low energy efficiency, despite a high color rendering index, and the fluorescent lamps have a problem of a low color rendering index and contain mercury causing environmental pollution, despite a good energy efficiency.

Accordingly, light emitting diodes (LEDs) have been proposed as a lighting apparatus capable of replacing fluorescent lamps or incandescent lamps. Such a light emitting diode is formed of an inorganic luminescent material, and luminous efficacy thereof has a maximum value in the blue wavelength band and decreases toward the red wavelength band and the green wavelength band, which has the highest visibility. Accordingly, a method of obtaining white light by combining a red LED with a green LED and a blue LED has a problem of reduction in luminous efficacy. Such a method also has a problem of reduction in color rendering properties due to a small width of an emission peak of each LED.

In order to overcome such problems, there has been proposed a lighting apparatus configured to emit white light through combination of a blue LED with yellow phosphors instead of combining a red LED with a green LED and a blue LED. This is because a method of obtaining white light through combination of a blue LED having high luminous efficacy with phosphors that emit yellow light when irradiated with blue light from the blue LED is more efficient than use of a green LED, which has low luminous efficacy.

However, such a lighting apparatus configured to emit white light through combination of the blue LED with the yellow phosphors has limited luminous efficacy due to low luminous efficacy of the yellow phosphors.

In order to solve such a problem of reduction in luminous efficiency, there has been proposed an OLED lighting apparatus using an organic light emitting device formed of an organic luminescent material. Generally, an organic light emitting device has relatively good luminous efficacy in the green and red wavelength regions, as compared with an inorganic light emitting device. In addition, such an organic light emitting device exhibits improved color rendering properties due to relatively wide emission peak in the blue, red, and green wavelength regions, as compared with an inorganic light emitting device, and thus can emit light similar to sunlight.

Such an organic light emitting device includes an anode, a cathode and an organic light emitting layer disposed between the anode and the cathode. Here, since the distance between the anode and the cathode is small, such an organic light emitting device for a lighting apparatus is vulnerable to pinholes due to penetration of foreign matter. In addition, the anode is likely to directly contact the cathode due to generation of cracks, an internal stepped structure of the organic light emitting device, and roughness of stacked layers, causing a short circuit between the anode and the cathode. Further, the short circuit between the anode and the cathode can also be caused when the thickness of the organic light emitting layer is smaller than a predetermined value due to process failure or process error during formation of the organic light emitting layer.

When a short circuit occurs between the anode and the cathode in the lighting apparatus, the short circuit region forms a low-resistance current path. As a result, current flows only in the short circuit region and little or no current flows through other regions of the organic light emitting device, thereby causing reduction in emission output of the organic light emitting device or emission failure of the organic light emitting device.

As a result, light from the lighting apparatus has luminance below a predetermined value, causing deterioration in quality of the lighting apparatus or failure of the lighting apparatus. In addition, pixels corresponding to the short circuit region become defective pixels, causing deterioration in quality of the lighting apparatus.

SUMMARY

The present disclosure is to provide an OLED lighting apparatus which can compensate for high sheet resistance of a first electrode formed of a transparent conductive material while improving light extraction efficiency through enhancement in aperture ratio.

For this purpose, in one aspect of the present disclosure, an OLED lighting apparatus comprising: a substrate; a first auxiliary wire disposed on the substrate; a second auxiliary wire connected to the first auxiliary wire and disposed on the substrate; a protective layer covering the substrate with the first auxiliary wire and the second auxiliary wire disposed thereon, the protective layer having a through-hole partially exposing the first auxiliary wire; a first electrode disposed on the protective layer, the first electrode being connected to the first auxiliary wire through the through-hole and having an opening partially exposing the protective layer; an organic light emitting layer disposed on the first electrode; and a second electrode disposed on the organic light emitting layer.

The OLED lighting apparatus according to the present disclosure replaces auxiliary wires with a first auxiliary wire and a second auxiliary wire to secure low resistance while retaining short circuit-prevention resistance.

As a result, the OLED lighting apparatus can compensate for high sheet resistance of the first electrode, thereby achieving normal light emission without reduction in luminance due to current drop when implemented as a large-area high-resolution lighting apparatus.

In accordance with aspects of the present disclosure, an OLED lighting apparatus omits auxiliary wires to increase aperture ratio and, instead of the auxiliary wires, includes a first auxiliary wire disposed at one side of each pixel and a second auxiliary wire having a small linewidth and disposed in matrix form within the pixel to be connected to the first auxiliary wire.

As a result, the OLED lighting apparatus according to the aspects can compensate for high resistance of a first electrode formed of a transparent conductive material such as ITO using the first auxiliary wire and the second auxiliary wire, while preventing reduction in aperture ratio through omission of auxiliary wires.

In addition, the entire area of the first auxiliary wire and the second auxiliary wire excluding portions corresponding to a through-hole can be stably protected by a protective layer, thereby improving reliability of the OLED lighting apparatus.

Further, since a signal applied to the first auxiliary wire and the second auxiliary wire is applied to the first electrode via a resistance pattern, a sufficiently long signal path can be secured by an opening of the first electrode disposed to surround the pixel such that the resistance pattern has a sufficiently elongated shape.

As a result, a short circuit-prevention resistance having a desired magnitude can be created through design change of the opening of the first electrode, thereby preventing the current from flowing only in the short circuit region when short circuit occurs between the first electrode and a second electrode.

Furthermore, the OLED lighting apparatus according to the aspects can compensate for high sheet resistance of the first electrode by replacing auxiliary wires with the first auxiliary wire and the second auxiliary wire to secure low resistance while retaining short circuit-prevention resistance, thereby achieving normal light emission without reduction in luminance due to current drop when implemented as a large-area high-resolution lighting apparatus.

As a result, in the OLED lighting apparatus according to the aspects, since auxiliary wires are omitted and, instead of the auxiliary wires, the first auxiliary wire is disposed only at one side of the pixel and the second auxiliary wire having a considerably small linewidth is disposed in matrix form within the pixel, a non-emission region can be limited to the regions in which the first auxiliary wire and the second auxiliary wire are disposed.

Thus, the OLED lighting apparatus according to the aspects allows light to be also emitted from a region in which auxiliary wires would otherwise be formed, thereby having increased aperture ratio.

According to the present disclosure, the OLED lighting apparatus omits auxiliary wires to increase aperture ratio and, instead of the auxiliary wires, includes the first auxiliary wire disposed at one side of each pixel and the second auxiliary wire having a small linewidth and disposed in matrix form within the pixel to be connected to the first auxiliary wire.

As a result, the OLED lighting apparatus according to the present disclosure can compensate for high resistance of a first electrode formed of a transparent conductive material such as ITO using the first auxiliary wire and the second auxiliary wire, while preventing reduction in aperture ratio through omission of auxiliary wires.

In addition, in the OLED lighting apparatus according to the present disclosure, since a signal applied to the first auxiliary wire and the second auxiliary wire is applied to the first electrode via a resistance pattern, a sufficiently long signal path can be secured by an opening of the first electrode disposed to surround the pixel such that the resistance pattern has a sufficiently elongated shape.

As a result, in the OLED lighting apparatus according to the present disclosure, a short circuit-prevention resistance having a desired magnitude can be created through design change of the opening of the first electrode, thereby preventing the current from flowing only in the short circuit region when short circuit occurs between the first electrode and a second electrode.

Furthermore, the OLED lighting apparatus according to the present disclosure can compensate for high sheet resistance of the first electrode by replacing the auxiliary wires with the first auxiliary wire and the second auxiliary wire to secure low resistance while retaining short circuit-prevention resistance, thereby achieving normal light emission without reduction in luminance due to current drop when implemented as a large-area high-resolution lighting apparatus.

In another aspect of the present disclosure, an OLED lighting apparatus comprising: a substrate; auxiliary wires disposed in matrix form on the substrate; a first electrode disposed on the substrate and having an opening, the auxiliary wires contacting the first electrode; an organic light emitting layer disposed on the first electrode; and a second electrode disposed on the organic light emitting layer.

In another aspect of the present disclosure, an OLED lighting apparatus, comprising: a substrate; an auxiliary wire disposed on the substrate; a protective layer disposed on the entire surface of the substrate with the auxiliary wire disposed thereon, the protective layer having a through-hole partially exposing the auxiliary wire; a first electrode disposed on the protective layer, the first electrode being connected to the auxiliary wire through the through-hole and having an opening partially exposing the protective layer; an organic light emitting layer disposed on the first electrode; and a second electrode disposed on the organic light emitting layer.

BRIEF DESCRIPTION OF THE DRAWINGS

The above and other aspects, features and advantages of the present disclosure will become apparent from the following description of aspects given in conjunction with the accompanying drawings.

DETAILED DESCRIPTION

Figure 1:
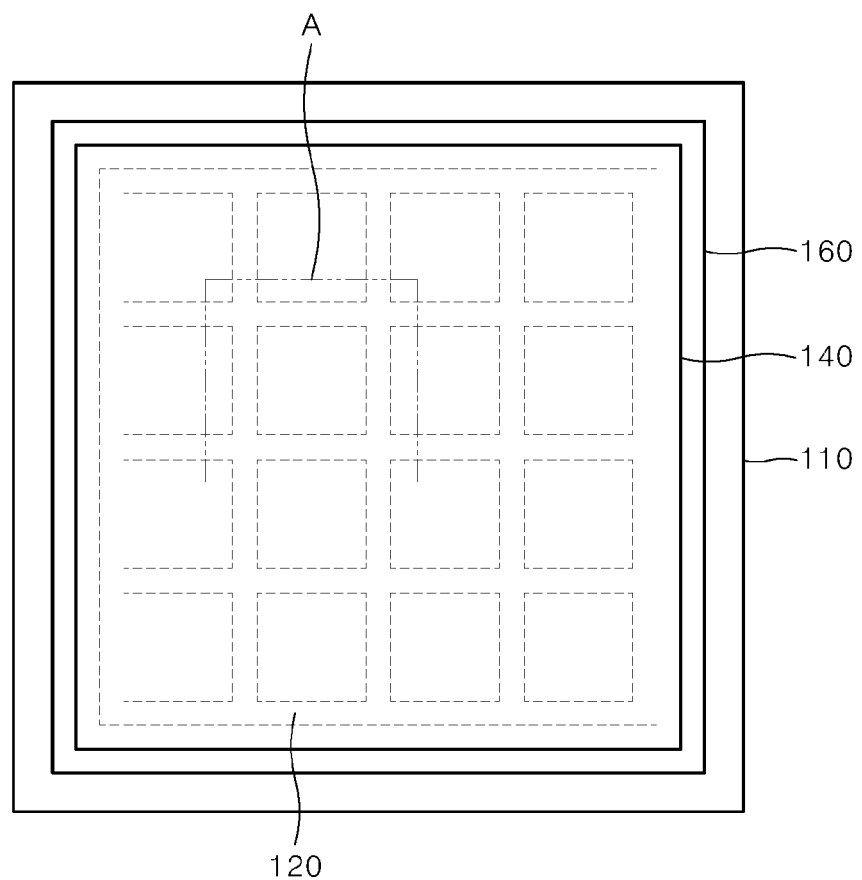
FIG. 1 is a plan view of an OLED lighting apparatus according to a first aspect of the present disclosure.

Hereinafter, aspects of the present disclosure will be described in detail with reference to the accompanying drawings. It should be understood that the present disclosure is not limited to the following aspects and may be embodied in different ways, and that the aspects are given to provide complete disclosure of the present disclosure and to provide thorough understanding of the present disclosure to those skilled in the art. Description of known functions and constructions which can unnecessarily obscure the subject matter of the present disclosure will be omitted. Like components will be denoted by like reference numerals throughout the specification.

Now, an OLED lighting apparatus according to a first exemplary aspect of the present disclosure will be described in detail with reference to the accompanying drawings.

Figure 2:
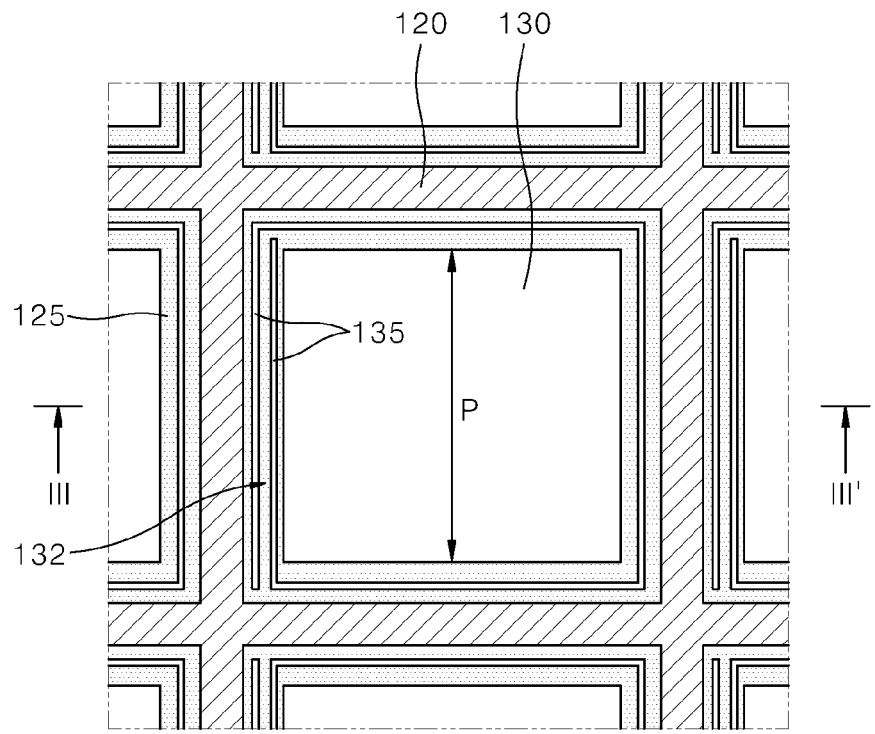
FIG. 2 is an enlarged plan view of portion A of FIG. 1.
Figure 3:
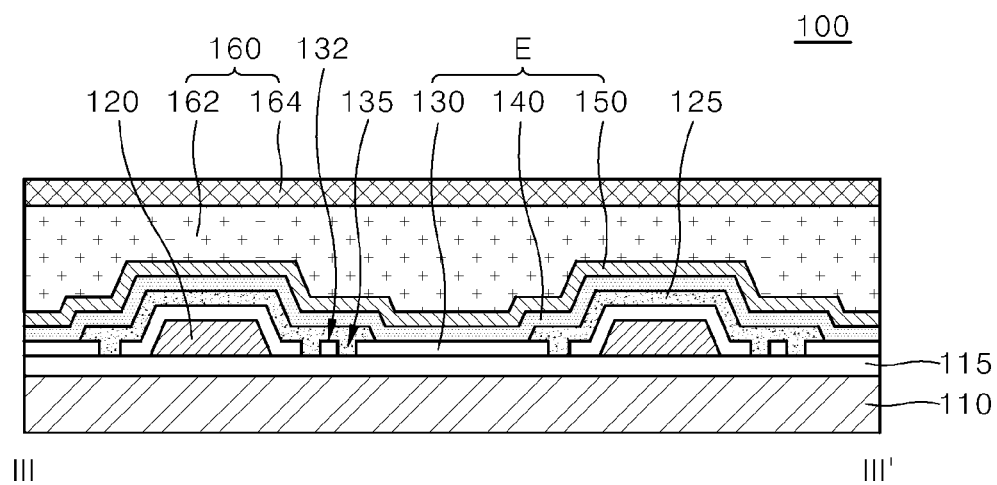
FIG. 3 is a cross-sectional view taken along line III-III' of FIG. 2.

FIG. 1 is a plan view of an OLED lighting apparatus according to a first aspect of the present disclosure, FIG. 2 is an enlarged plan view of portion A of FIG. 1, and FIG. 3 is a cross-sectional view taken along line III-III' of FIG. 2.

Referring to FIG. 1 to FIG. 3, an OLED lighting apparatus 100 according to the first aspect includes a buffer layer 115 disposed on a substrate 110 and an organic light emitting device E disposed on the buffer layer 115.

The organic light emitting device E includes a first electrode 130 disposed on the buffer layer 115, an organic light emitting layer 140 disposed on the first electrode 130, and a second electrode 150 disposed on the organic light emitting layer 140. In the OLED lighting apparatus 100 having such a structure, the organic light emitting layer 140 emits light when a signal is applied to the first electrode 130 and the second electrode 150 of the organic light emitting device E, whereby light emission over the entire substrate 110 can be achieved.

Here, auxiliary wires 120 are arranged in matrix form on the substrate 110. The auxiliary wires 120 are formed of a metal having high electrical conductivity to allow uniform voltage to be applied to the first electrode 130 disposed over the entire substrate 110, whereby the OLED lighting apparatus 100 can emit light with uniform luminance even when implemented as a large lighting apparatus. The auxiliary wires 120 may be disposed between the buffer layer 115 and the first electrode 130 to directly contact the first electrode 130.

The first electrode 130 is formed of a transparent conductive material, such as ITO, and advantageously transmits emitted light therethrough. However, the first electrode 130 has a drawback of high resistance. Accordingly, when the OLED lighting apparatus 100 is implemented as a large-area lighting apparatus, current spreading in a wide active area is not uniform due to high resistance of the transparent conductive material. Such non-uniform current spreading makes it difficult for the large OLED lighting apparatus 100 to emit light with uniform luminance.

The auxiliary wires 120 are arranged in matrix form over the entire substrate 110 to allow uniform voltage to be applied to the first electrode 130 on the substrate 110, whereby the large OLED lighting apparatus 100 can emit light with uniform luminance.

For this purpose, the auxiliary wires 120 may have a linewidth of 5 µm or greater, or may be in a range of 5 µm to 50 µm. The auxiliary wires 120 may be formed of one of Al, Au, Cu, Ti, W, Mo, Cr, and alloys thereof. The auxiliary wires 120 may have a monolayer structure or a multilayer structure.

Although the auxiliary wires 120 are shown as disposed on a lower surface of the first electrode 130 herein, it should be understood that the present disclosure is not limited thereto and the auxiliary wires 120 may be disposed on an upper surface of the first electrode 130.

The substrate 110 may be divided into a plurality of unit pixels P by the auxiliary wires 120 arranged in matrix form. Since the auxiliary wires 120 have much a lower resistance than the first electrode 130, a voltage for the first electrode 130 is applied to the first electrode 130 through the auxiliary wires 120 rather than being directly applied to the first electrode 130. In this way, the first electrode 130 formed over the entire substrate 110 can be divided into the plurality of pixels P by the auxiliary wires 120.

A protective layer 125 is disposed on the first electrode 130. Specifically, the protective layer 125 is disposed on the first electrode 130 to cover the auxiliary wires 120.

Since the auxiliary wires 120 are formed of an opaque metal, light cannot be emitted from regions in which the auxiliary wires 120 are formed. Accordingly, the protective layer 125 is formed only on portions of an upper surface of the first electrode 130, under which the auxiliary wires 120 are disposed, whereby light can be emitted only from light emitting regions of the pixels. In other words, the protective layer 125 is formed only on the other regions except for the center region of each pixel P.

In addition, the protective layer 125 may be formed to surround the auxiliary wires 120 to reduce surface roughness caused by the auxiliary wires 120 such that the organic light emitting layer 140 and the second electrode 150 can be subsequently stacked in a stable manner without disconnection.

For this purpose, the protective layer 125 may be formed of an inorganic material, such as $SiO_x$ or $SiN_x$. Alternatively, the protective layer 125 may be formed of an organic material, such as photoacryl, or may be composed of a plurality of layers including an inorganic layer and an organic layer.

The organic light emitting layer 140 and the second electrode 150 are sequentially disposed on the first electrode 130 and the protective layer 125.

The organic light emitting layer 140 may be formed of an organic luminescent material that emits white light. For example, the organic light emitting layer 140 may be composed of a blue organic light emitting layer, a red organic light emitting layer, and a green organic light emitting layer. Alternatively, the organic light emitting layer 140 may have a tandem structure including a blue light emitting layer and a yellow-green light emitting layer. However, it should be understood that the present disclosure is not limited thereto and the organic light emitting layer 140 may be configured in various ways.

Although not shown in the drawings, the organic light emitting device E may further include: an electron injection layer and a hole injection layer which inject electrons and holes into the organic light emitting layer 140, respectively; an electron transport layer and a hole transport layer which transport injected electrons and holes to the organic light emitting layer 140; and a charge generation layer which generates charges such as electrons and holes.

The organic light emitting layer 140 may be formed of a material that receives holes and electrons from the hole transport layer and the electron transport layer, respectively, to emit light in the visible region through recombination of the holes and the electrons. Particularly, a material having good quantum efficiency for fluorescence or phosphorescence may be used. Examples of the material may include an 8-hydroxyquinoline aluminum complex ($Alq_3$), a carbazole compound, a dimerized styryl compound, BAlq, a 10-hydroxybenzoquinoline-metal compound, benzoxazole, benzthiazole, and benzimidazole compounds, and poly(p-phenylene vinylene) (PPV), without being limited thereto.

The second electrode 150 may be formed of a metal, such as Ca, Ba, Mg, Al, and Ag, or alloys thereof.

The first electrode 130, the organic light emitting layer 140, and the second electrode 150 constitute the organic light emitting device E. Here, the first electrode 130 is an anode of the organic light emitting device E and the second electrode 150 is a cathode of the organic light emitting device E. When voltage is applied between the first electrode 130 and the second electrode 150, electrons and holes are injected into the organic light emitting layer 140 from the second electrode 150 and the first electrode 130, respectively, thereby generating excitons in the organic light emitting layer 140. As the excitons decay, light corresponding to energy difference between a lowest unoccupied molecular orbital (LUMO) and a highest occupied molecular orbital (HOMO) of the organic light emitting layer 140 is generated and emitted toward the substrate 110.

In addition, the OLED lighting apparatus 100 according to the first aspect may further include an encapsulation layer 160 covering the second electrode 150 on the substrate 110 having the organic light emitting device E formed thereon.

The encapsulation layer 160 may include an adhesive layer 162 and a base layer 164 disposed on the adhesive layer 162. In this way, the encapsulation layer 160 is disposed on the substrate 110 having the organic light emitting device E thereon such that the OLED lighting apparatus 100 can be sealed by the base layer 164 attached to the adhesive layer 162.

Here, the adhesive layer 162 may be formed of a photocurable adhesive or a thermosetting adhesive. The base layer 164 serves to prevent penetration of moisture or air from the outside and may be formed of any material so long as the material can perform this function. For example, the base layer 164 may be formed of a polymeric material, such as polyethylene terephthalate (PET), or a metallic material, such as an aluminum foil, an Fe—Ni alloy, and an Fe—Ni—Co alloy.

Referring to FIG. 2 and FIG. 3, in the OLED lighting apparatus 100 according to the first aspect, the first electrode 130 is disposed within a pixel P defined by the auxiliary wires 120 arranged in matrix form and the auxiliary wires 120 are electrically connected to the first electrode 130 through a resistance pattern 132 having relatively high resistance.

Accordingly, in the OLED lighting apparatus 100 according to the first aspect, a signal applied to the auxiliary wires 120 is applied to the first electrode 130 via the resistance pattern 132. Thus, a sufficiently long signal path can be secured when an opening 135 of the first electrode 130 is disposed to surround the pixel P such that the resistance pattern 132 can be sufficiently long. As a result, a short circuit-prevention resistance having a desired magnitude can be created through design change of the opening 135 of the first electrode 130.

That is, the opening 135 of the first electrode 130 is disposed to surround the pixel P to define the resistance pattern 132 having an elongated shape, wherein the resistance pattern 132 is a part of the first electrode 130. A signal applied to the auxiliary wires 120 is applied to the first electrode 130 through the resistance pattern 132.

In this way, the opening 135 is provided by partially removing the first electrode 130 disposed over the auxiliary wires 120 and the substrate 110, whereby the resistance pattern 132 formed of the same material as the first electrode 130 can be provided.

As a result, in the OLED lighting apparatus according to the present disclosure, a short circuit-prevention resistance having a desired magnitude can be created through design change of the opening of the first electrode, thereby preventing the current from flowing only in the short circuit region when short circuit occurs between the first electrode and a second electrode.

However, in the OLED lighting apparatus 100 according to the first aspect, since light is not emitted from regions in which the auxiliary wires 120, the opening 135 of the first electrode 130, and the resistance pattern 132 are disposed, these regions are covered with the protective layer 125, thereby causing reduction in the overall aperture ratio of the OLED lighting apparatus 100.

In particular, since the resistance pattern 132 is required to have a predetermined width and length to obtain a predetermined resistance value, the resistance pattern 132 is required to occupy a certain area within the pixel P, irrespective of the area of the pixel P. As a result, the aperture ratio the OLED lighting apparatus 100 according to the first aspect is decreased by about 8.5%, as compared with that of an OLED lighting apparatus not having short circuit-prevention resistance.

Accordingly, when the OLED lighting apparatus 100 is implemented as a high-resolution lighting apparatus having a small pixel size, the aperture ratio of the OLED lighting apparatus can be decreased below a predetermined value, thereby causing quality failure of the OLED lighting apparatus 100.

In order words, creation of short circuit-prevention resistance using the opening 135 of the first electrode 130 and the resistance pattern 132 can reduce the aperture ratio of the pixel P, making it difficult to fabricate a high-resolution OLED lighting apparatus.

If the auxiliary wires 120 on the substrate 110 are eliminated to overcome reduction in the aperture ratio, uniformity of light emission can be reduced due to high resistance of the first electrode 130, which is formed of a transparent conductive material, such as ITO, and disposed over the entire surface of the substrate 110.

In order to solve such problems, an OLED lighting apparatus according to a second aspect omits auxiliary wires to increase aperture ratio and, instead of the auxiliary wires, includes a first auxiliary wire disposed at one side of each pixel and a second auxiliary wire having a small linewidth and disposed in matrix form within the pixel to be connected to the first auxiliary wire.

As a result, the OLED lighting apparatus according to the second aspect can compensate for high resistance of the first electrode formed of a transparent conductive material such as ITO using the first auxiliary wire and the second auxiliary wire, while preventing reduction in the aperture ratio through omission of the auxiliary wires.

Now, the OLED lighting apparatus according to the second aspect will be described in detail with reference to the accompanying drawings.

Figure 4:
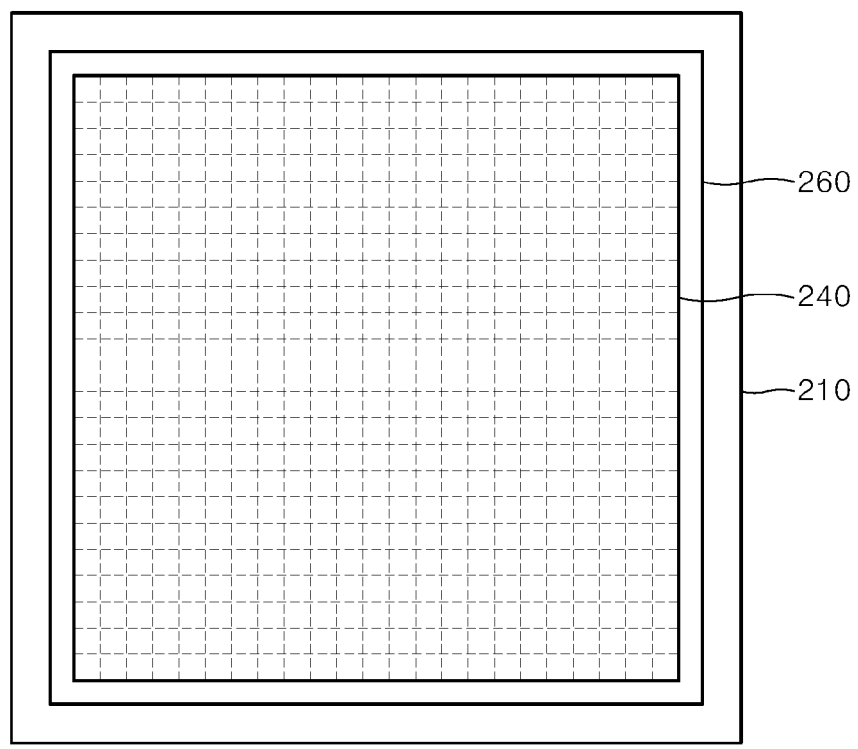
FIG. 4 is a plan view of the OLED lighting apparatus according to a second aspect of the present disclosure.
Figure 5:
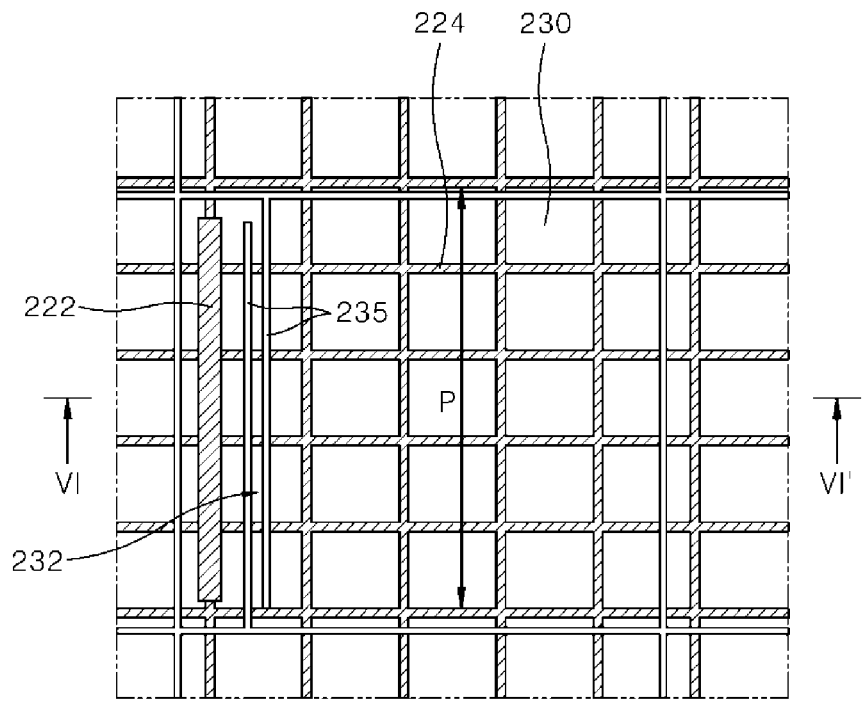
FIG. 5 is a plan view of a unit pixel of the OLED lighting apparatus according to the second aspect.
Figure 6:
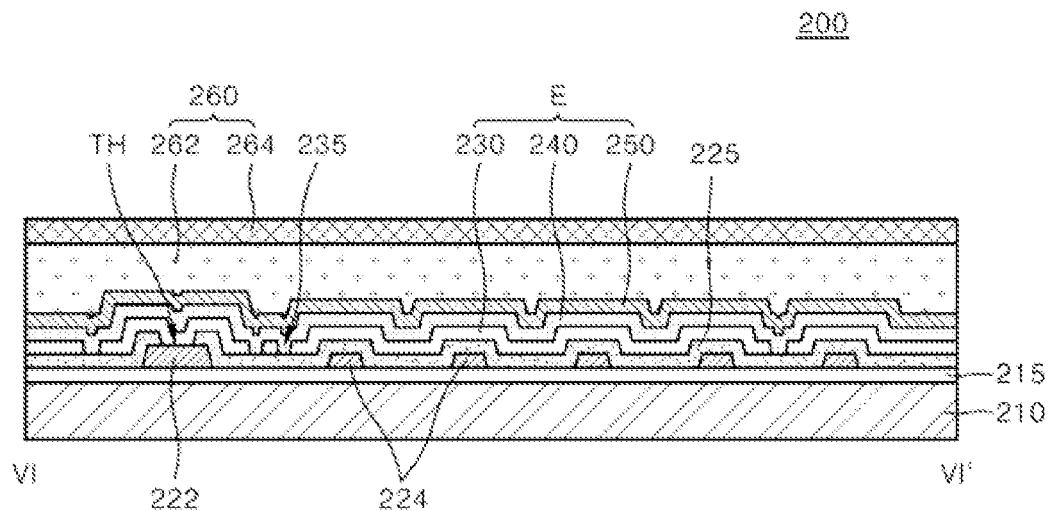
FIG. 6 is a cross-sectional view taken along line VI-VI' of FIG. 5.

FIG. 4 is a plan view of the OLED lighting apparatus according to the second aspect of the present disclosure, FIG. 5 is a plan view of a unit pixel of the OLED lighting apparatus according to the second aspect, and FIG. 6 is a cross-sectional view taken along line VI-VI' of FIG. 5.

Referring to FIG. 4 to FIG. 6, the OLED lighting apparatus according to the second aspect includes a buffer layer 215 disposed on the entire surface of a substrate 210 and a first auxiliary wire 222 disposed on the buffer layer 215.

The substrate 210 may be formed of transparent glass. Alternatively, the substrate 210 may be formed of a polymeric material having flexibility.

The buffer layer 215 serves to block penetration of moisture or air from below. For this purpose, the buffer layer 215 may be formed of an inorganic material, such as $SiO_x$ or $SiN_x$. The buffer layer 215 may be omitted.

The first auxiliary wire 222 is disposed on the buffer layer 215 on the substrate 210. Accordingly, the buffer layer 215 is disposed between the substrate 210 and the first auxiliary wire 222 and between the substrate 210 and a second auxiliary wire 224.

The second auxiliary wire 224 is disposed on the buffer layer 215 on the substrate 210 to be connected to the first auxiliary wire 222. The second auxiliary wire 224 is disposed in the form of a crossed matrix form within a pixel P on the substrate.

The second auxiliary wire 224 may have a linewidth less than or equal to two times the linewidth of the auxiliary wires 120 (FIG. 2) according to the first aspect. More specifically, the second auxiliary wire 224 may have a linewidth of 1 μm to 3 μm. If the linewidth of the second auxiliary wire 224 is less than 1 μm, it is difficult to reduce resistance of the first electrode 230, despite increase in an aperture ratio. If the linewidth of the second auxiliary wire 224 exceeds 3 μm, the area occupied by the second auxiliary wire 224 can be increased and a light emission area in the pixel can be decreased, thereby causing reduction in the aperture ratio.

Here, the first auxiliary wire 222 is disposed on the same layer as the second auxiliary wire 224 and is formed of the same metal material as the second auxiliary wire 224. Thus, the first auxiliary wire 222 is integrally connected to the second auxiliary wire 224 on the same layer. However, the first auxiliary wire 222 and the second auxiliary wire 224 may be disposed on different layers.

A protective layer 225 covers the substrate 210 having the first auxiliary wire 222 and the second auxiliary wire 224 disposed thereon and has a through-hole TH partially exposing the first auxiliary wire 222. Here, the first auxiliary wire 222 is exposed over at least half of an area thereof by the through-hole TH and directly contacts a first electrode 230 of an organic light emitting device E. The protective layer 225 is formed in the emitting region of the pixel.

The protective layer 225 may be formed of an inorganic material, such as $SiO_x$ or $SiN_x$. Alternatively, the protective layer 225 may be formed of an organic material, such as photoacryl, or may be composed of a plurality of layers including an inorganic layer and an organic layer.

In this way, the entire region of the first auxiliary wire 222 and the second auxiliary wire 224 excluding a portion corresponding to the through-hole TH can be stably protected by the protective layer 225, thereby improving reliability of the OLED lighting apparatus 200.

In particular, the OLED lighting apparatus 200 according to the second aspect can compensate for high sheet resistance of the first electrode 230 formed of a transparent conductive material, such as ITO, by replacing auxiliary wires with the first auxiliary wire 222 and the second auxiliary wire 224 to secure low resistance, thereby achieving normal light emission without reduction in luminance due to current drop when implemented as a large-area high-resolution lighting apparatus.

Each of the first auxiliary wire 222 and the second auxiliary wire 224 may be formed of a metal having good electrical conductivity to compensate for high sheet resistance of the first electrode 230. Specifically, each of the first auxiliary wire 222 and the second auxiliary wire 224 may be formed of any one selected from among Al, Au, Cu, Ti, W, Mo, and alloys thereof.

Particularly, according to the second aspect, the first auxiliary wire 222 may have a higher thickness than the second auxiliary wire 224 so as to prevent reduction in luminance due to current drop when the OLED lighting apparatus 200 is implemented as a large-area high-resolution lighting apparatus.

Thus, the first auxiliary wire 222 may have a first thickness and the second auxiliary wire 224 may have a second thickness smaller than the first thickness. The second thickness may be 20% to 60% the first thickness. If the second thickness is less than 20% the first thickness, it is difficult to reduce resistance of the first electrode 230. If the second thickness exceeds 60% the first thickness, it is difficult to reduce the linewidth of the second auxiliary wire 224 due to an excessively great thickness of the second auxiliary wire, causing reduction in aperture ratio.

As described above, in the second aspect, the second auxiliary wire 224 is integrally connected to the first auxiliary wire 222, which, in turn, is electrically connected directly to the first electrode 230 through the through-hole TH, such that high sheet resistance of the first electrode 230 can be compensated for by the second auxiliary wire 224 and the first auxiliary wire 222, thereby reducing the sheet resistance of the first electrode to 10Ω/□ or less.

In order to reduce the sheet resistance of the first electrode 230, the first auxiliary wire 222 is advantageously disposed to surround four sides of each pixel P. However, if the first auxiliary wire 222 is disposed at the four sides of each pixel P, there is a problem in that the overall aperture ratio of the OLED lighting apparatus 200 is reduced since no light can be emitted from the region in which the first auxiliary wire 222 is disposed.

Accordingly, in the second aspect of the present disclosure, the first auxiliary wire 222 is disposed only at one side of the pixel P on the substrate 210, that is, at one side of a region in which the auxiliary wires would otherwise be disposed, and the first auxiliary wire 222 and the second auxiliary wire 224 are electrically connected to the first electrode 230, such that the OLED lighting apparatus 200 can achieve normal light emission without reduction in luminance due to current drop while preventing reduction in the overall aperture ratio of the OLED lighting apparatus.

In this way, the OLED lighting apparatus 200 according to the second aspect allows a non-emission region thereof to be limited to the regions in which the first auxiliary wire 222 and the second auxiliary wire 224 are disposed by replacing the auxiliary wires with the first auxiliary wire 222 disposed only at one side of the pixel P and the second auxiliary wire 224 having a considerably small linewidth and disposed in matrix form within the pixel P.

Thus, the OLED lighting apparatus 200 according to the second aspect allows light to also be emitted from the region in which the auxiliary wires would otherwise be disposed, thereby improving the aperture ratio.

As a result, the OLED lighting apparatus 100 according to the first aspect has an aperture ratio of about 80%, whereas the OLED lighting apparatus 200 according to the second aspect has an aperture ratio of about 90% or higher.

The organic light emitting device E includes the first electrode 230, an organic light emitting layer 240 disposed on the first electrode 230, and a second electrode 250 disposed on the organic light emitting layer 240.

The first electrode 230 on the protective layer 225 is connected to the first auxiliary wire 222 through the through-hole TH of the protective layer 225 and has an opening 235 partially exposing the protective layer 225. Here, the first electrode 230 is formed of a transparent conductive material including one of indium tin oxide (ITO), indium zinc oxide (IZO), and indium tin zinc oxide (ITZO). Thus, the first electrode 230 can transmit light, but has much higher electrical resistance than metal.

Like in the first aspect, in the second aspect of the present disclosure, a signal applied to the first auxiliary wire 222 and the second auxiliary wire 224 is applied to the first electrode 230 via the resistance pattern 232. Thus, a sufficiently long signal path can be secured when the opening 235 of the first electrode 230 is disposed to surround the pixel P such that the resistance pattern 232 can be sufficiently long. As a result, a short circuit-prevention resistance having a desired magnitude can be created through design change of the opening 235 of the first electrode 230, thereby preventing the current from flowing only in the short circuit region when short circuit occurs between the first electrode 230 and the second electrode 250.

That is, the opening 235 of the first electrode 230 is disposed to surround the pixel P to define the resistance pattern 232 having an elongated shape, wherein the resistance pattern 232 is a part of the first electrode 230. The signal applied to the first auxiliary wire 222 and the second auxiliary wire 224 is applied to the first electrode 230 via the resistance pattern 232.

Thus, the OLED lighting apparatus 200 according to the second aspect can compensate for high sheet resistance of the first electrode 230 by replacing the auxiliary wires with the first auxiliary wire 222 and the second auxiliary wire 224 to secure low resistance while retaining short circuit-prevention resistance, thereby achieving normal light emission without reduction in luminance due to current drop when implemented as a large-area high-resolution lighting apparatus.

The organic light emitting layer 240 may be formed of an organic luminescent material that emits white light. For example, the organic light emitting layer 240 may include a blue organic light emitting layer, a red organic light emitting layer, and a green organic light emitting layer. Alternatively, the organic light emitting layer 240 may have a tandem structure including a blue light emitting layer and a yellow-green light emitting layer. However, it should be understood that the present disclosure is not limited thereto and the organic light emitting layer 240 may be configured in various ways.

Although not shown, the organic light emitting device E may further include: an electron injection layer and a hole injection layer which inject electrons and holes into the organic light emitting layer 240, respectively; an electron transport layer and a hole transport layer which transport injected electrons and holes to the organic light emitting layer; and a charge generation layer which generates charges such as electrons and holes.

The organic light emitting layer 240 may be formed of a material that receives holes and electrons from the hole transport layer and the electron transport layer, respectively, to emit light in the visible region through recombination of the holes and the electrons. Particularly, a material having good quantum efficiency for fluorescence or phosphorescence may be used. Examples of such a material may include an 8-hydroxyquinoline aluminum complex ($Alq_3$), a carbazole compound, a dimerized styryl compound, BAlq, a 10-hydroxybenzoquinoline-metal compound, benzoxazole, benzothiazole, and benzimidazole compounds, and poly(p-phenylenevinylene) (PPV), without being limited thereto.

The second electrode 250 may be formed of a metal, such as Ca, Ba, Mg, Al, or Ag, or alloys thereof.

Here, the first electrode 230 is an anode of the organic light emitting device E and the second electrode 250 is a cathode of the organic light emitting device E. When voltage is applied between the first electrode 230 and the second electrode 250, electrons and holes are injected into the organic light emitting layer 240 from the second electrode 250 and the first electrode 230, respectively, thereby generating excitons in the organic light emitting layer 240. As the excitons decay, light corresponding to energy difference between a lowest unoccupied molecular orbital (LUMO) and a highest occupied molecular orbital (HOMO) of the organic light emitting layer 240 is generated and emitted toward the substrate 210.

In addition, the OLED lighting apparatus 200 according to the second aspect may further include an encapsulation layer 260.

The encapsulation layer 260 is disposed to cover the second electrode 250 of the organic light emitting device E.

The encapsulation layer 260 may include an adhesive layer 262 and a base layer 264 disposed on the adhesive layer 262. In this way, the encapsulation layer 260 including the adhesive layer 262 and the base layer 264 is disposed on the substrate 210 having the organic light emitting device E formed thereon, such that the OLED lighting apparatus 200 can be sealed by the base layer 264 attached to the adhesive layer 262.

Here, the adhesive layer 262 may be formed of a photo-curable adhesive or a thermosetting adhesive. The base layer 264 serves to prevent penetration of moisture or air from the outside and may be formed of any material so long as the material can perform this function. For example, the base layer 264 may be formed of a polymeric material, such as polyethylene terephthalate (PET), or a metallic material, such as an aluminum foil, an Fe—Ni alloy, or an Fe—Ni—Co alloy.

As in the first aspect, in the OLED lighting apparatus according to the second aspect, since a signal applied to the first auxiliary wire 222 and the second auxiliary wire 224 is applied to the first electrode 230 via the resistance pattern 232, when the opening 235 of the first electrode 230 is disposed to surround the pixel P such that the resistance pattern 232 can be sufficiently long, a sufficiently long signal path can be secured. As a result, a short circuit-prevention resistance having a desired magnitude can be created through design change of the opening 235 of the first electrode 230.

Accordingly, the OLED lighting apparatus 200 according to the second aspect can compensate for high sheet resistance of the first electrode 230 by replacing the auxiliary wires with the first auxiliary wire 222 and the second auxiliary wire 224 to secure low resistance while retaining short circuit-prevention resistance, thereby achieving normal light emission without reduction in luminance due to current drop when embodied as a large-area high-resolution lighting apparatus.

Next, a method of manufacturing the OLED lighting apparatus according to the second aspect of the present disclosure will be described with reference to the accompanying drawings.

FIG. 7 to FIG. 10 are plan views illustrating a method of manufacturing the OLED lighting apparatus according to the second aspect of the present disclosure and FIG. 11 to FIG. 14 are cross-sectional views illustrating the method of manufacturing the OLED lighting apparatus according to the second aspect of the present disclosure.

Figure 7:
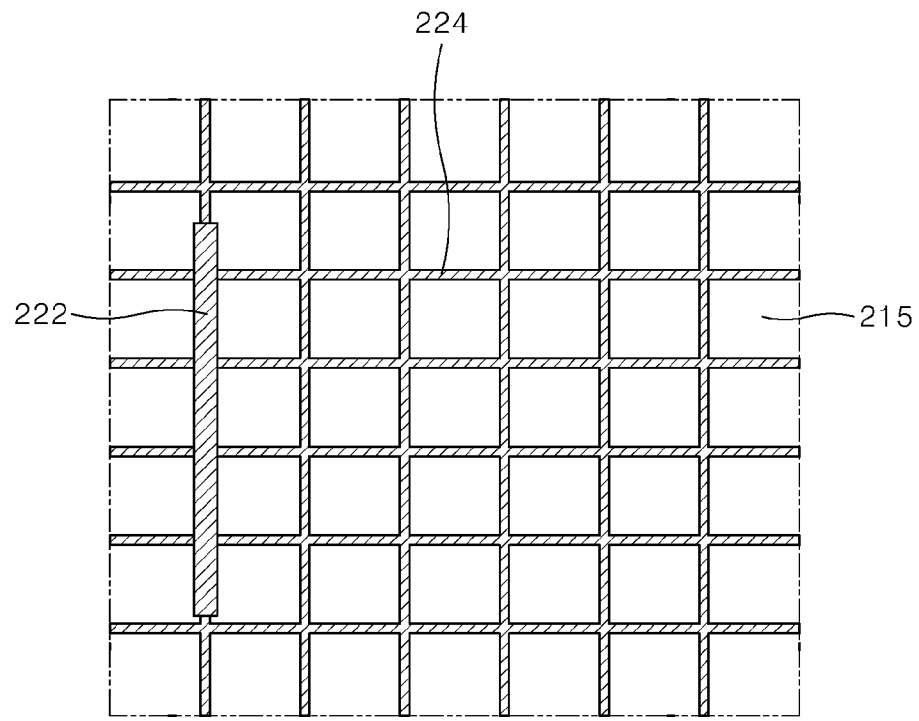
FIG. 7 to FIG. 10 are plan views illustrating a method of manufacturing the OLED lighting apparatus according to the second aspect.
Figure 11:
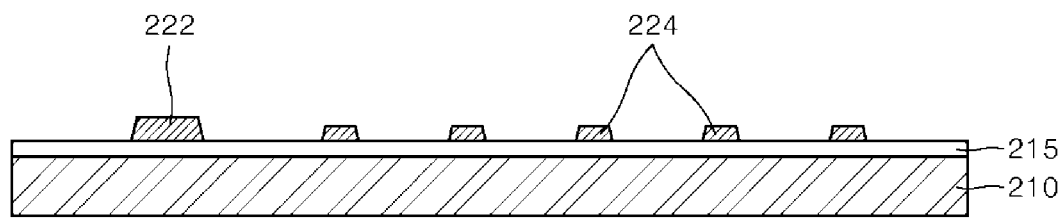
FIG. 11 to FIG. 14 are sectional views illustrating the method of manufacturing the OLED lighting apparatus according to the second aspect.

Referring to FIG. 7 and FIG. 11, a buffer layer 215 is formed on the entire surface of a substrate 210.

Here, the substrate 210 may be formed of transparent glass. Alternatively, the substrate 210 may be formed of a polymeric material having flexibility.

The buffer layer 215 serves to block penetration of moisture or air from below. For this purpose, the buffer layer 215 may be formed of an inorganic material, such as $SiO_x$ or $SiN_x$. The buffer layer 215 may be omitted.

Next, a first auxiliary wire 222 and a second auxiliary wire 224 are formed on the buffer layer 215. By way of example, the first auxiliary wire 222 and the second auxiliary wire 224 may be formed by sputtering a target material including any one selected from among Al, Au, Cu, Ti, W, Mo, and alloys thereof to form a metal layer (not shown) and selectively patterning the metal layer using a halftone mask.

Accordingly, the first auxiliary wire 222 is disposed on the same layer as the second auxiliary wire 224 and formed of the same material as the second auxiliary wire 224. Thus, the first auxiliary wire 222 may be integrally connected to the second auxiliary wire 224 on the same layer.

Here, the second auxiliary wire 224 is disposed in the form of a crossed matrix within the pixel P on the substrate 210.

The linewidth of the second auxiliary wire 224 may be less than or equal to two times the linewidth of the auxiliary wires. More specifically, the second auxiliary wire 224 may have a linewidth of 1 µm to 3 µm.

Here, the first auxiliary wire 222 has a first thickness and the second auxiliary wire 224 has a second thickness smaller than the first thickness. The second thickness is 20% to 60% the first thickness.

Figure 8:
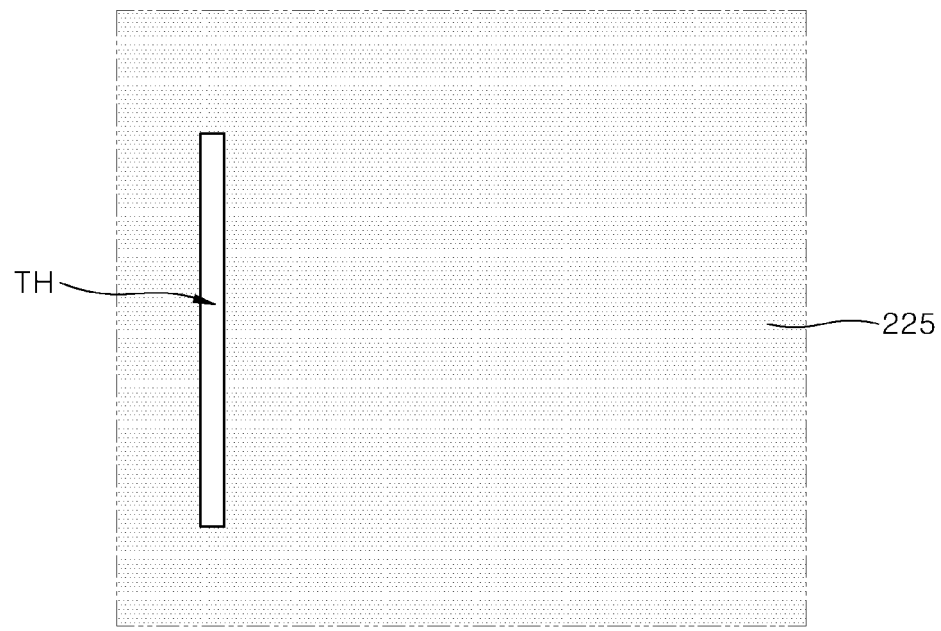
Figure 12:
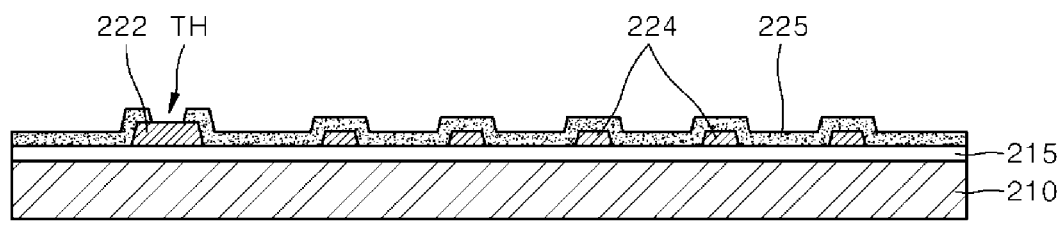

Referring to FIG. 8 and FIG. 12, an protective layer 225 is formed to cover the entire surface of the substrate 210 having the first auxiliary wire 222 and the second auxiliary wire 224 formed thereon.

The protective layer 225 may be formed of an inorganic material, such as $SiO_x$ or $SiN_x$. Alternatively, the protective layer 225 may be formed of an organic material, such as photoacryl, or may be composed of a plurality of layers including an inorganic layer and an organic layer.

Next, a through-hole TH is formed to partially expose the first auxiliary wire 222 by selectively patterning a portion of the protective layer 225 using a photomask.

Here, the through-hole TH may exposes at least half of the area of the first auxiliary wire 222 so as to increase contact area between the first auxiliary wire 222 and the first electrode 230 (FIG. 13) of the organic light emitting device, thereby improving contact reliability.

In this way, the entire area of the first auxiliary wire 222 and the second auxiliary wire 224 excluding a portion corresponding to the through-hole TH can be stably protected by the protective layer 225, thereby improving reliability of the OLED lighting apparatus.

Figure 9:
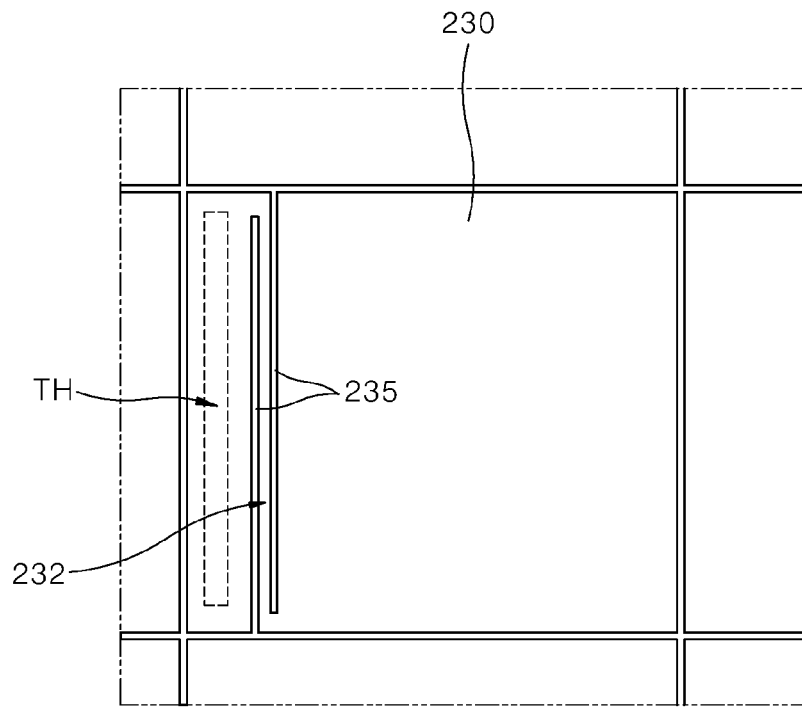
Figure 13:
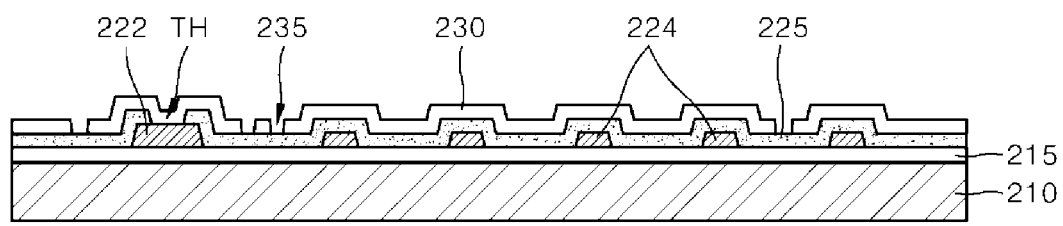

Referring to FIG. 9 and FIG. 13, a first electrode 230 is formed on the substrate 210, with the protective layer 225 having the through-hole TH formed thereon. Accordingly, the first electrode 230 is directly electrically connected to the first auxiliary wire 222 exposed by the through-hole TH.

Here, the first electrode 230 is formed of a transparent conductive material such as ITO, IZO, and ITZO to allow transmission of light therethrough.

Next, an opening 235 is formed to partially expose the protective layer 225 by patterning a portion of the first electrode 230 in each pixel.

As in the first aspect, in the OLED lighting apparatus according to the second aspect, since a signal applied to the first auxiliary wire 222 and the second auxiliary wire 224 is applied to the first electrode 230 via a resistance pattern 232, a sufficiently long signal path can be secured by forming the opening 235 of the first electrode 230 to surround the pixel P such that the resistance pattern 232 has a sufficiently elongated shape. As a result, a short circuit-prevention resistance having a desired magnitude can be created through design change of the opening 235 of the first electrode 230.

Figure 10:
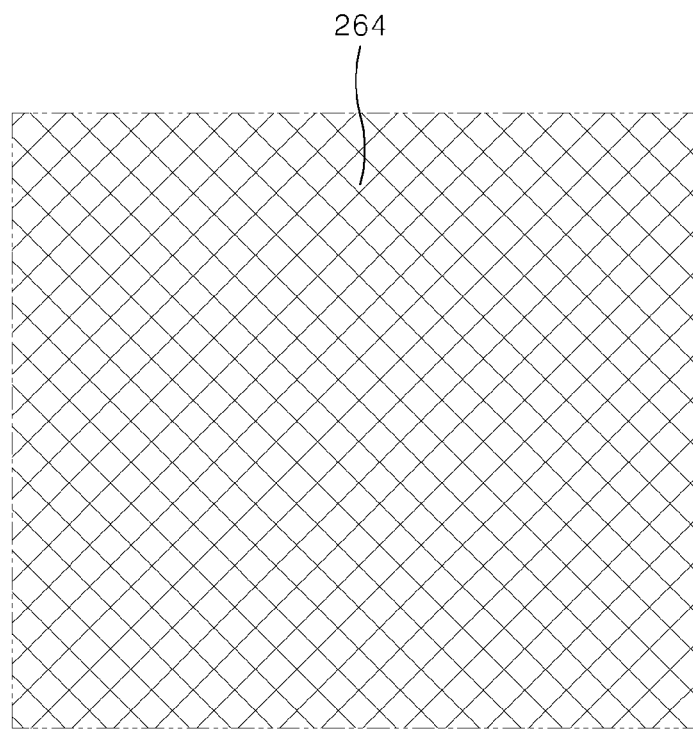
Figure 14:
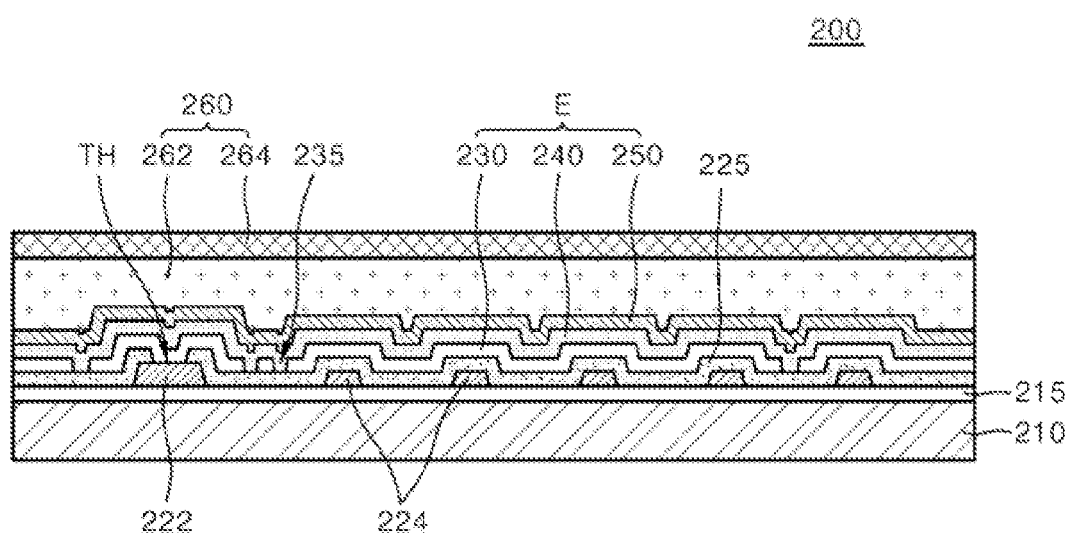

Referring to FIG. 10 and FIG. 14, an organic light emitting layer 240 and a second electrode 250 are sequentially formed on the first electrode 230. Here, the first electrode 230, the organic light emitting layer 240, and the second electrode 250 constitute the organic light emitting device E. The organic light emitting layer 240 may be formed of an organic luminescent material that emits white light. For example, the organic light emitting layer 240 may include a blue organic light emitting layer, a red organic light emitting layer, and a green organic light emitting layer. Alternatively, the organic light emitting layer 240 may have a tandem structure including a blue light emitting layer and a yellow-green light emitting layer.

The second electrode 250 may be formed of a metal, such as Ca, Ba, Mg, Al, or Ag, or alloys thereof.

Next, an encapsulation layer 260 is attached to the substrate 210 with the organic light emitting device E formed thereon.

The encapsulation layer 260 may include an adhesive layer 262 and a base layer 264 disposed on the adhesive layer 262. In this way, the encapsulation layer 260 including the adhesive layer 262 and the base layer 264 is disposed on the substrate 210 having the organic light emitting device E formed thereon, whereby the OLED lighting apparatus 200 can be sealed by the base layer 264 attached to the adhesive layer 262.

Here, the adhesive layer 262 may be formed of a photo-curable adhesive or a thermosetting adhesive. The base layer 264 serves to prevent penetration of moisture or air from the outside and may be formed of any suitable material so long as the material can perform this function. For example, the base layer 264 may be formed of a polymeric material, such as polyethylene terephthalate (PET), or a metallic material, such as an aluminum foil, an Fe—Ni alloy, and an Fe—Ni—Co alloy.

In the method of manufacturing the OLED lighting apparatus according to the second aspect, the auxiliary wires can be omitted to improve an aperture ratio and, instead of the auxiliary wires, the first auxiliary wire may be placed at one side of each pixel and the second auxiliary wire having a small linewidth is disposed in matrix form within the pixel to be connected to the first auxiliary wire.

As a result, the method of manufacturing the OLED lighting apparatus according to the second aspect can compensate for high resistance of the first electrode formed of a transparent conductive material, such as ITO, using the first auxiliary wire and the second auxiliary wire, while preventing reduction in aperture ratio through omission of the auxiliary wires.

In addition, in the method of manufacturing the OLED lighting apparatus according to the second aspect, since a signal applied to the first auxiliary wire and the second auxiliary wire is applied to the first electrode via the resistance pattern, a sufficiently long signal path can be secured by the opening of the first electrode disposed to surround the pixel such that the resistance pattern has a sufficiently elongated shape. As a result, a short circuit-prevention resistance having a desired magnitude can be created through design change of the opening of the first electrode.

Further, the method of manufacturing the OLED lighting apparatus according to the second aspect can compensate for high sheet resistance of the first electrode by replacing the auxiliary wires with the first auxiliary wire and the second auxiliary wire to secure low resistance while allowing the OLED lighting apparatus to retain short circuit-prevention resistance, whereby the OLED lighting apparatus can achieve normal light emission without reduction in luminance due to current drop when embodied as a large-area high-resolution lighting apparatus.

Although some aspects have been described herein, it should be understood by those skilled in the art that these aspects are given by way of illustration only and the present disclosure is not limited thereto. In addition, it should be understood that various modifications, variations, and alterations can be made by those skilled in the art without departing from the spirit and scope of the present disclosure.

| <List of Referene Numerals> | |
|---|---|
| 200: OLED lighting apparatus | 210: substrate |
| 215: buffer layer | 222: first auxiliary wire |
| 224: second auxiliary wire | 225: protective layer |
| 230: first electrode | 235: opening of first electrode |
| 240: organic light emitting layer | 250: second electrode |
| 260: encapsulation layer | 262: adhesive layer |
| 264: base layer | E: organic light emitting device |
| TH: through-hole | |

What is claimed is:

1. An OLED lighting apparatus having a plurality of unit pixels, comprising:
   a substrate;
   an auxiliary wire disposed in a matrix form and including a first part adjacently disposed at a boundary of a unit pixel and a second part disposed within the unit pixel on the substrate, wherein the second part has a plurality of horizontal segments and a plurality of vertical segments;
   a protective layer disposed on the entire surface of the substrate and covering the first and second parts of the auxiliary wire, wherein the protective layer has a through-hole exposing the first part of the auxiliary wire adjacent to the boundary of the unit pixel;
   a first electrode disposed on the protective layer within the unit pixel,
   wherein the first electrode has a first portion directly connected to the first part of the auxiliary wire through the through-hole of the protective layer, a second portion covering the second part of the auxiliary wire which has a matrix form and a resistance pattern connecting the first portion and the second portion, and
   wherein the resistance pattern is formed by a trench in the first electrode and the trench is extended along all of the boundary of the unit pixel, and the resistance pattern is disposed between one of the vertical segments of the second part of the auxiliary wire and the first part of the auxiliary wire that is adjacent to the one of the vertical segments of the second part of the auxiliary wire;
   an organic light emitting layer disposed on the first electrode and covering the resistance pattern; and
   a second electrode disposed on the organic light emitting layer,
   wherein a line width of the first part of the auxiliary wire exposed by the through-hole is greater than a line width of the second part of the auxiliary wire.

2. The OLED lighting apparatus according to claim 1, wherein the line width of the second part of the auxiliary wire is in a range of 1 µm to 3 µm.

3. The OLED lighting apparatus according to claim 1, wherein the first part of the auxiliary wire has a first thickness and the second part of the auxiliary wire has a second thickness smaller than the first thickness.

4. The OLED lighting apparatus according to claim 3, wherein the second thickness is 20% to 60% of the first thickness.

5. The OLED lighting apparatus according to claim 1, wherein the first part of the auxiliary wire is adjacent to only one side of the first electrode within the unit pixel.

6. The OLED lighting apparatus according to claim 1, further comprising a buffer layer disposed between the substrate and the auxiliary wire, and an encapsulation layer covering the second electrode.

7. The OLED lighting apparatus according to claim 1, wherein the OLED lighting apparatus has an aperture ratio of 90% or higher.

* * * * *